(12) United States Patent
Forbes

(10) Patent No.: US 7,193,893 B2
(45) Date of Patent: Mar. 20, 2007

(54) WRITE ONCE READ ONLY MEMORY EMPLOYING FLOATING GATES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 433 days.

(21) Appl. No.: 10/177,083

(22) Filed: Jun. 21, 2002

(65) Prior Publication Data

US 2003/0235077 A1 Dec. 25, 2003

(51) Int. Cl.
*G11C 16/04* (2006.01)

(52) U.S. Cl. .............................. 365/185.05; 365/185.28

(58) Field of Classification Search ............ 365/185.05, 365/185.28
See application file for complete search history.

(56) References Cited

U.S. PATENT DOCUMENTS

| | | | |
|---|---|---|---|
| 3,381,114 A | 4/1968 | Nakanuma | 219/385 |
| 3,641,516 A | 2/1972 | Casrucci et al. | 365/96 |
| 3,665,423 A | 5/1972 | Nakamuma et al. | 340/173 R |
| 3,877,054 A | 4/1975 | Boulin et al. | 357/23 |
| 3,964,085 A | 6/1976 | Kahng et al. | 428/428 |

(Continued)

FOREIGN PATENT DOCUMENTS

| | | |
|---|---|---|
| JP | 62-199019 | 9/1987 |
| JP | 03-222367 | 10/1991 |
| JP | 50-90169 | 4/1993 |
| JP | 06-224431 | 8/1994 |
| JP | 06-302828 | 10/1994 |
| JP | 08-255878 | 10/1996 |
| JP | 2001-332546 | 11/2001 |
| WO | WO-9907000 A2 | 2/1999 |
| WO | WO-9917371 A1 | 4/1999 |

OTHER PUBLICATIONS

Aarik, Jaan, et al., "Phase transformations in hafnium dioxide thin films grown by atomic layer doposition at high temperatures", *Applied Surface Science, 173(1–2)*, (Mar. 2001),15–21.

Aarik, Jaan, et al., "Texture development in nanocrystalline hafnium dioxide thin films grown by atomic layer deposition", *Journal of Crystal Growth, 220(1–2)*, (2000),105–113.

Abbas, S. A., et al., "N–Channel Igfet Design Limitations Due to Hot Electron Trapping", *Technical Digest, International Electron Devices Meeting.*, Washington, DC,(Dec. 1975),35–38.

Adelmann, C, et al., "Atomic–layer epitaxy of GaN quantum wells and quantum dots on (0001) AlN", *Journal of Applied Physics, 91(8)*, (Apr. 15, 2002),5498–5500.

(Continued)

*Primary Examiner*—Tuan T. Nguyen
(74) *Attorney, Agent, or Firm*—Schwegman, Lundberg, Woessner & Kluth, P.A.

(57) ABSTRACT

Structures and methods for write once read only memory employing floating gates are provided. The write once read only memory cell includes a floating gate transistor formed in a modified dynamic random access memory (DRAM) fabrication process. The floating gate transistor has a first source/drain region, a second source/drain region, a channel region between the first and the second source/drain regions, a floating gate separated from the channel region by a gate insulator, and a control gate separated from the floating gate by a gate dielectric. A plug couples the first source/drain region to an array plate. A bitline is coupled to the second source/drain region. The floating gate transistor can be programmed by trapping charge on the floating gate.

23 Claims, 7 Drawing Sheets

U.S. PATENT DOCUMENTS

| | | | |
|---|---|---|---|
| 4,152,627 A | 5/1979 | Priel et al. ............... 315/227 |
| 4,215,156 A | 7/1980 | Dalal et al. ............... 427/84 |
| 4,217,601 A | 8/1980 | DeKeersmaecker et al. .. 357/54 |
| 4,333,808 A | 6/1982 | Bhattacharyya et al. 204/192 D |
| 4,399,424 A | 8/1983 | Rigby ...................... 338/34 |
| 4,413,022 A | 11/1983 | Suntola et al. ........... 427/255.2 |
| 4,507,673 A | 3/1985 | Aoyama et al. .......... 357/23 R |
| 4,590,042 A | 5/1986 | Drage ................... 422/186.06 |
| 4,647,947 A | 3/1987 | Takeoka et al. ......... 346/135.1 |
| 4,661,833 A | 4/1987 | Mizutani ............... 365/185.01 |
| 4,767,641 A | 8/1988 | Kieser et al. ............... 427/38 |
| 4,888,733 A | 12/1989 | Mobley ..................... 365/145 |
| 4,920,071 A | 4/1990 | Thomas ..................... 437/188 |
| 4,939,559 A | 7/1990 | DiMaria et al. ........... 357/23.5 |
| 4,993,358 A | 2/1991 | Mahawili .................. 118/715 |
| 5,006,192 A | 4/1991 | Deguchi ................... 156/345 |
| 5,021,999 A | 6/1991 | Kohda et al. .............. 365/168 |
| 5,027,171 A | 6/1991 | Reedy et al. .............. 357/23.5 |
| 5,042,011 A | 8/1991 | Casper et al. .............. 365/205 |
| 5,080,928 A | 1/1992 | Klinedinst et al. ........... 427/70 |
| 5,111,430 A | 5/1992 | Morie ...................... 365/185 |
| 5,141,260 A | 8/1992 | Burwell ................. 365/189.07 |
| 5,198,029 A | 3/1993 | Dutta et al. ................ 118/303 |
| 5,253,196 A | 10/1993 | Shimabukuro ............... 365/45 |
| 5,280,205 A | 1/1994 | Green et al. ................ 307/530 |
| 5,293,560 A | 3/1994 | Harari ...................... 365/165 |
| 5,298,447 A | 3/1994 | Hong ......................... 437/43 |
| 5,317,535 A | 5/1994 | Talreja et al. .............. 365/185 |
| 5,388,069 A | 2/1995 | Kokubo .................... 365/185 |
| 5,399,516 A | 3/1995 | Bergendahl et al. .......... 437/43 |
| 5,410,504 A | 4/1995 | Ward ....................... 365/149 |
| 5,424,993 A | 6/1995 | Lee et al. .................. 365/218 |
| 5,430,670 A | 7/1995 | Rosenthal .................... 365/45 |
| 5,434,815 A | 7/1995 | Smarandoiu et al. .. 365/189.01 |
| 5,438,544 A | 8/1995 | Makino ..................... 365/185 |
| 5,449,941 A | 9/1995 | Yamazaki et al. ........... 257/411 |
| 5,457,649 A | 10/1995 | Eichman et al. ............. 365/174 |
| 5,467,306 A | 11/1995 | Kaya et al. ............... 365/185.2 |
| 5,477,485 A | 12/1995 | Bergemont et al. .... 365/185.24 |
| 5,485,422 A | 1/1996 | Bauer et al. ................. 365/168 |
| 5,493,140 A | 2/1996 | Iguchi ....................... 257/316 |
| 5,508,543 A | 4/1996 | Hartstein et al. ........... 257/314 |
| 5,530,581 A | 6/1996 | Cogan ....................... 359/265 |
| 5,530,668 A | 6/1996 | Chern et al. ................ 365/145 |
| 5,539,279 A | 7/1996 | Takeuchi et al. ........... 365/145 |
| 5,541,871 A | 7/1996 | Nishimura et al. ......... 365/145 |
| 5,541,872 A | 7/1996 | Lowrey et al. ............. 365/145 |
| 5,550,770 A | 8/1996 | Kuroda ...................... 365/145 |
| 5,572,459 A | 11/1996 | Wilson et al. .............. 365/145 |
| 5,595,606 A | 1/1997 | Fujikawa et al. ............ 118/725 |
| 5,600,587 A | 2/1997 | Koike ....................... 365/145 |
| 5,627,781 A | 5/1997 | Hayashi et al. ........... 365/185.2 |
| 5,627,785 A | 5/1997 | Gilliam et al. ......... 365/189.01 |
| 5,670,790 A | 9/1997 | Katoh et al. ................. 257/14 |
| 5,698,022 A | 12/1997 | Glassman et al. |
| 5,714,766 A | 2/1998 | Chen et al. .................. 257/20 |
| 5,735,960 A | 4/1998 | Sandhu et al. ......... 118/723 IR |
| 5,740,104 A | 4/1998 | Forbes ................... 365/185.03 |
| 5,754,477 A | 5/1998 | Forbes ................... 365/185.33 |
| 5,768,192 A | 6/1998 | Eitan ..................... 365/185.24 |
| 5,795,808 A | 8/1998 | Park ......................... 438/301 |
| 5,801,105 A | 9/1998 | Yano et al. .................. 438/785 |
| 5,801,401 A | 9/1998 | Forbes ........................ 257/77 |
| 5,810,923 A | 9/1998 | Yano et al. ................... 117/84 |
| 5,822,256 A | 10/1998 | Bauer et al. ................. 365/200 |
| 5,828,080 A | 10/1998 | Yano et al. ................... 257/43 |
| 5,828,605 A | 10/1998 | Peng et al. .............. 365/185.29 |
| 5,840,897 A | 11/1998 | Kirlin et al. .................. 546/2 |
| 5,852,306 A | 12/1998 | Forbes ...................... 257/315 |
| 5,856,688 A | 1/1999 | Lee et al. ................... 257/295 |
| 5,886,368 A | 3/1999 | Forbes et al. ................ 257/77 |
| 5,912,488 A | 6/1999 | Kim et al. .................. 257/316 |
| 5,916,365 A | 6/1999 | Sherman ...................... 117/92 |
| 5,936,274 A | 8/1999 | Forbes et al. ............... 257/315 |
| 5,943,262 A | 8/1999 | Choi ..................... 365/185.17 |
| 5,950,925 A | 9/1999 | Fukunaga et al. ........ 239/132.3 |
| 5,959,896 A | 9/1999 | Forbes ................... 365/185.33 |
| 5,973,356 A | 10/1999 | Noble et al. ................ 257/319 |
| 5,989,958 A | 11/1999 | Forbes ....................... 438/257 |
| 5,991,225 A | 11/1999 | Forbes et al. .......... 365/230.06 |
| 6,013,553 A | 1/2000 | Wallace et al. .............. 438/287 |
| 6,020,024 A | 2/2000 | Maiti et al. ................ 427/248.1 |
| 6,027,961 A | 2/2000 | Maiti et al. ................ 438/199 |
| 6,031,263 A | 2/2000 | Forbes et al. ............... 257/315 |
| 6,034,882 A | 3/2000 | Johnson et al. ............. 365/103 |
| 6,057,271 A | 5/2000 | Kenjiro et al. .............. 505/475 |
| 6,059,885 A | 5/2000 | Ohashi et al. .............. 118/730 |
| 6,072,209 A | 6/2000 | Noble et al. ................ 257/296 |
| 6,110,529 A | 8/2000 | Gardiner et al. ............ 427/250 |
| 6,115,281 A | 9/2000 | Aggarwal et al. ........... 365/145 |
| 6,124,729 A | 9/2000 | Noble et al. .................. 326/41 |
| 6,125,062 A | 9/2000 | Ahn et al. ............. 365/198.07 |
| 6,140,181 A | 10/2000 | Forbes et al. ............... 438/257 |
| 6,141,237 A | 10/2000 | Eliason et al. ............... 365/145 |
| 6,141,238 A | 10/2000 | Forbes et al. ............... 365/145 |
| 6,141,260 A | 10/2000 | Ahn et al. ............. 365/189.07 |
| 6,143,636 A | 11/2000 | Forbes et al. ............... 438/587 |
| 6,150,687 A | 11/2000 | Noble et al. ................ 257/302 |
| 6,153,468 A | 11/2000 | Forbes et al. ............... 438/257 |
| 6,161,500 A | 12/2000 | Kopacz et al. ........... 118/723 E |
| 6,166,401 A | 12/2000 | Forbes ........................ 257/77 |
| 6,171,900 B1 | 1/2001 | Sun ........................... 438/240 |
| 6,185,122 B1 | 2/2001 | Johnson et al. ............. 365/103 |
| 6,203,613 B1 | 3/2001 | Gates et al. ................ 117/104 |
| 6,206,972 B1 | 3/2001 | Dunham ..................... 118/715 |
| 6,211,035 B1 | 4/2001 | Moise et al. ................ 438/396 |
| 6,212,103 B1 | 4/2001 | Ahrens et al. ........... 365/185.29 |
| 6,222,768 B1 | 4/2001 | Hollmer et al. |
| 6,225,168 B1 | 5/2001 | Gardner et al. ............. 438/287 |
| 6,232,643 B1 | 5/2001 | Forbes et al. ............... 257/405 |
| 6,238,976 B1 | 5/2001 | Noble et al. ................ 438/259 |
| 6,243,300 B1 | 6/2001 | Sunkavalli .............. 365/185.29 |
| 6,246,606 B1 | 6/2001 | Forbes et al. ........... 365/185.03 |
| 6,249,020 B1 | 6/2001 | Forbes et al. ............... 257/315 |
| 6,252,793 B1 | 6/2001 | Allen et al. ................. 365/145 |
| 6,269,023 B1 | 7/2001 | Derhacobian et al. . 365/185.24 |
| 6,281,144 B1 | 8/2001 | Cleary et al. ............... 438/780 |
| 6,294,813 B1 * | 9/2001 | Forbes et al. ............... 257/321 |
| 6,297,539 B1 | 10/2001 | Ma et al. .................... 257/410 |
| 6,302,964 B1 | 10/2001 | Umotoy et al. .............. 118/715 |
| 6,303,481 B2 | 10/2001 | Park .......................... 438/591 |
| 6,313,518 B1 | 11/2001 | Ahn et al. .................. 257/632 |
| 6,320,784 B1 | 11/2001 | Muralidhar et al. |
| 6,320,786 B1 | 11/2001 | Chang et al. |
| 6,337,805 B1 | 1/2002 | Forbes et al. ............... 365/145 |
| 6,351,411 B2 | 2/2002 | Forbes et al. ............... 365/182 |
| 6,368,941 B1 | 4/2002 | Chen et al. ................. 438/424 |
| 6,380,579 B1 | 4/2002 | Nam et al. .................. 257/306 |
| 6,387,712 B1 | 5/2002 | Yano et al. ...................... 438/3 |
| 6,391,769 B1 | 5/2002 | Lee et al. ................... 438/643 |
| 6,407,435 B1 | 6/2002 | Ma et al. .................... 257/411 |
| 6,429,063 B1 | 8/2002 | Eitan |
| 6,432,779 B1 | 8/2002 | Hobbs et al. ............... 438/287 |
| 6,438,031 B1 | 8/2002 | Fastow .................. 365/185.18 |
| 6,444,039 B1 | 9/2002 | Nguyen ..................... 118/715 |
| 6,444,895 B1 | 9/2002 | Nikawa ...................... 136/212 |
| 6,445,023 B1 | 9/2002 | Vaartstra et al. ............ 257/295 |
| 6,445,030 B1 | 9/2002 | Wu et al. .................... 257/315 |
| 6,449,188 B1 | 9/2002 | Fastow .................. 365/185.18 |
| 6,456,531 B1 | 9/2002 | Wang et al. ............ 365/185.18 |
| 6,456,536 B1 | 9/2002 | Sobek et al. ............ 365/185.28 |

| | | | |
|---|---|---|---|
| 6,458,701 B1 | 10/2002 | Chae et al. | 438/680 |
| 6,459,618 B1 | 10/2002 | Wang | 385/185.18 |
| 6,465,306 B1 | 10/2002 | Ramsbey et al. | |
| 6,465,334 B1 | 10/2002 | Buynoski et al. | 438/591 |
| 6,487,121 B1 | 11/2002 | Thurgate et al. | 365/185.18 |
| 6,490,204 B2 | 12/2002 | Bloom et al. | |
| 6,495,436 B2 | 12/2002 | Ahn et al. | 438/591 |
| 6,498,362 B1 | 12/2002 | Forbes et al. | 257/295 |
| 6,504,755 B1 | 1/2003 | Katayama et al. | 365/185.15 |
| 6,514,828 B2 | 2/2003 | Ahn et al. | 438/297 |
| 6,521,911 B2 | 2/2003 | Parsons et al. | 257/52 |
| 6,521,950 B1 | 2/2003 | Shimabukuro et al. | 257/350 |
| 6,521,958 B1 | 2/2003 | Forbes et al. | 257/391 |
| 6,534,420 B2 | 3/2003 | Ahn et al. | 438/768 |
| 6,545,314 B2 | 4/2003 | Forbes et al. | |
| 6,552,387 B1 | 4/2003 | Eitan | 257/324 |
| 6,559,014 B1 | 5/2003 | Jeon | 438/287 |
| 6,567,303 B1 * | 5/2003 | Hamilton et al. | 365/185.03 |
| 6,567,312 B1 | 5/2003 | Torii et al. | 365/185.28 |
| 6,570,787 B1 | 5/2003 | Wang et al. | 365/185.17 |
| 6,580,124 B1 | 6/2003 | Cleeves et al. | 257/331 |
| 6,580,118 B2 | 7/2003 | Ludwig et al. | |
| 6,586,785 B2 | 7/2003 | Flagan et al. | 257/261 |
| 6,674,138 B1 | 1/2004 | Halliyal et al. | |
| 6,867,097 B1 | 3/2005 | Ramsbey et al. | |
| 2002/0003252 A1 | 1/2002 | Iyer | 257/315 |
| 2002/0027264 A1 | 3/2002 | Forbes et al. | 257/662 |
| 2002/0036939 A1 | 3/2002 | Tsai | 365/201 |
| 2002/0074565 A1 | 6/2002 | Flagan et al. | 257/200 |
| 2002/0089023 A1 | 7/2002 | Yu et al. | 257/411 |
| 2002/0109158 A1 | 8/2002 | Forbes et al. | 257/224 |
| 2002/0155688 A1 | 10/2002 | Ahn et al. | 438/592 |
| 2002/0155689 A1 | 10/2002 | Ahn et al. | 29/76 |
| 2002/0192974 A1 | 12/2002 | Ahn et al. | 257/315 |
| 2003/0017717 A1 | 1/2003 | Ahn | 438/768 |
| 2004/0063276 A1 | 4/2004 | Yamamoto et al. | |

OTHER PUBLICATIONS

Ahn, Seong–Deok, et al., "Surface Morphology Improvement of Metalorganic Chemical Vapor Deposition Al Films by Layered Deposition of Al and Ultrathin TiN", *Japanese Journal of Applied Physics, Part 1 (Regular Papers, Short Notes & Review Papers), 39(6A)*, (Jun. 2000),3349–3354.

Akasaki, I., "Effects of AlN Buffer Layer on Crystallographic Structure and on Electrical and Optical Properties of GaN and Ga(1–x)Al(x)N [0< x (< or =) 0.4] Films Grown on Sapphire Substrate by MOVPE", *Journal of Crystal Growth, 98*, (1989),209–219.

Asari, K, et al., "Multi–mode and multi–level technologies for FeRAM embedded reconfigurable hardware", *Solid–State Circuits Conference, 1999, Digest of Technical Papers, ISSCC, 1999 IEEE International, Feb. 15–17, 1999*, (1999), 106–107.

Benjamin, M., "UV Photoemission Study of Heteroepitaxial AlGaN Films Grown on 6H–SiC", *Applied Surface Science, 104/105*, (Sep. 1996),455–460.

Bermudez, V., "The Growth and Properties of Al and AlN Films on GaN(0001)–(1×1)", *Journal of Applied Physics, 79(1)*, (Jan. 1996),110–119.

Bright, A A., et al., "Low–rate plasma oxidation of Si in a dilute oxygen/helium plasma for low–temperature gate quality Si/Sio2 interfaces", *Applied Physics Letters, 58(6)*, (Feb. 1991),619–621.

Britton, J, et al., "Metal–nitride–oxide IC memory retains data for meter reader", *Electronics, 45(22)*, (Oct. 23, 1972), 119–23.

Bunshah, Rointan F., et al., "Deposition Technlogies for Films and Coatings: Developments and Applications", *Park Ridge, N.J., U.S.A.: Noyes Publications*, (1982),102–103.

Carter, R J., "Electrical Characterization of High–k Materials Prepared By Atomic Layer CVD", *IWGI*, (2001), 94–99.

Chae, Junghun, et al., "Atomic Layer Deposition of Nickel by the Reduction of Preformed Nickel Oxide", *Electrochemical & Solid–State Letters, 5(6)*, (Jun. 2002),C64–C66.

Chaitsak, Suticai, et al., "Cu(InGa)Se/sub 2/ thin–film solar cells with high resisitiviey ZnO buffer layers deposited by atomic layer deposition", *Japanese Journal of Applied Physics Part 1–Regular Papers Short Notes & Review Papers, 38(9A)*, (Sep. 1999),4989–4992.

Chang, C., "Novel Passivation Dielectrics–The Boron– or Phosphorus–Doped Hydrogenated Amorphous Silicon Carbide Films", *Journal of the Electrochemical Society, 132*, (Feb. 1985),418–422.

Cheng, Baohong, et al., "The Impact of High–k Gate Dielectrics and Metal Gate Electrodes on Sub–100nm MOSFET's", *IEEE Transactions on Electron Devices, 46(7)*, (Jul. 1999),1537–1544.

Copel, M., et al., "Structure and stability of ultrathin zirconium oxide layers on Si(001)", *Applied Physicsl Letters, 76(4)*, (Jan. 2000),436–438.

Cricchi, J R., et al., "Hardened MNOS/SOS electrically reprogrammable nonvolatile memory", *IEEE Transactions on Nuclear Science, 24(6)*, (Dec. 1977),2185–9.

Demichelis, F., "Influence of Doping on the Structural and Optoelectronic Properties of Amorphous and Microcrystalline Silicon Carbide", *Journal of Applied Physics, 72*, (Aug. 15, 1992),1327–1333.

Demichelis, F., "Physical Properties of Undoped and Doped Microcrystalline SiC:H Deposited By PECVD", *Materials Research Society Symposium Proceedings, 219*, Anaheim, CA,(Apr. 30–May 3, 1991),413–418.

Desu, S B., "Minimization of Fatigue in Ferroelectric Films", *Physica Status Solidi A, 151(2)*, (1995),467–480.

Dimaria, D., "Graded or stepped energy band–gap–insulator MIS structures (GI–MIS or SI–MIS)", *J. Appl. Phys., 50(9)*, (Sep., 1979),5826–5829.

Dimaria, D J., "Graded or stepped energy band–gap–insulator MIS structures (GI–MIS or SI–MIS)", *Journal of Applied Physics, 50(9)*, (Sep. 1979),5826–5829.

Dipert, Brian, "Flash Memory Goes Mainstream", *IEEE Spectrum, 30(10)*, (Oct. 1993),48–52.

Eitan, Boaz, "NROM: A Novel Localized Trapping, 2–Bit Nonvolatile Memory Cell", *IEEE Electron Device Letters, 21(11)*, (Nov. 2000),543–545.

Elam, J W., "Kinetics of the WF6 and Si2H6 surface reactions during tungsten atomic layer deposition", *Surface Science, 479(1–3)*, (May 2001),121–135.

Engelhardt, M., "Modern Applications of Plasma Etching and Patterning in Silicon Process Technology", *Contributions to Plasma Physics, 39(5)*, (1999),473–478.

Fauchet, P M., et al., "Optoelectronics and photovoltaic applications of microcrystalline SiC", *Symp. on Materials Issues in Mecrocrystalline Semiconductors*, (1989),291–292.

Ferris–Prabhu, A V., "Tunneling theories of non–volatile semiconductor memories", *Physica Status Solidi A, 35(1)*, (May 16, 1976),243–50.

Fisch, D E., et al., "Analysis of thin film ferroelectric aging", *Proc. IEEE Int. Reliability Physics Symp.*, (1990),237–242.

Forbes, L., et al., "Field Induced Re–Emission of Electrons Trapped in SiO", *IEEE Transactions on Electron Devices, ED–26(11)*, Briefs,(Nov. 1979),1816–1818.

Forsgren, Katarina, "Atomic Layer Deposition of HfO2 using hafnium iodide", *Conference held in Monterey, California*, (May 2001),1 page.

Frohman–Bentchkowsky, D, "An integrated metal–nitride–oxide–silicon (MNOS) memory", *Proceedings of the IEEE, 57(6)*, (Jun. 1969),1190–1192.

Fuyuki, Takashi, et al., "Electronic Properties of the Interface between Si and TiO2 Deposited at Very Low Temperatures", *Japanese Journal of Applied Physics, Part 1 (Regular Papers & Short Notes), 25(9)*, (Sep. 1986),1288–1291.

Fuyuki, Takashi, et al., "Initial stage of ultra–thin SiO/sub 2/ formation at low temperatures using activated oxygen", *Applied Surface Science, 117–118*, (Jun. 1997),123–126.

Gartner, M, et al., "Spectroellipsometric characterization of lanthanide–doped TiO2 films obtained via the sol–gel technique", *Thin Solid Films, 234(1–2)*, (1993),561–565.

Geller, S., et al., "Crystallographic Studies of Perovskite–like Compounds. II. Rare Earth Aluminates", *Acta Cryst. vol. 9*, (May 1956),1019–1025.

Giess, E. A., et al., "Lanthanide gallate perovskite–type substrates for epitaxial, high–T/sub c/ superconducting Ba/sub 2/YCu/sub 3/O/sub 7– delta / films", *IBM Journal of Research and Development, 34(6)*, (Nov. 1990),916–926.

Goodwins, Rupert, "New Memory Technologies on the Way", http://zdnet.com.com/2100–1103–846950.html, (Feb. 2002).

Guha, S, et al., "Atomic beam deposition of lanthanum–and yttrium–based oxide thin films for gate dielectrics", *Appl. Phys. Lett., 77*, (2000),2710–2712.

Hirayama, Masaki, et al., "Low–Temperature Growth of High–Integrity Silicon Oxide Films by Oxygen Radical Generated in High Density Krypton Plasma", *International Electron Devices Meeting 1999, Technical Digest*, (1999), 249–252.

Hubbard, K. J., et al., "Thermodynamic stability of binary oxides in contact with silicon", *Journal of Materials Research, 11(11)*, (Nov. 1996),2757–2776.

Hunt, C. E., et al., "Direct bonding of micromachined silicon wafers for laser diode heat exchanger applications", *Journal of Micromechanics and Microengineering, 1(3)*, (Sep. 1991),152–156.

Hwang, C G., "Semiconductor Memories for the IT Era", *2002 IEEE International Solid–State Circuits Conference, Digest of Technical Papers IEEE, Part vol. 1*, San Francisco, (2002),24–27.

Hwang, N., et al., "Tunneling and Thermal Emission of Electrons from a Distribution of Deep Traps in SiO", *IEEE Transactions on Electron Devices, 40(6)*, (Jun. 1993),1100–1103.

Iddles, D M., et al., "Relationships between dopants, microstructure and the microwave dielectric properties of ZrO2–TiO2–SnO2 ceramics", *Journal of Materials Science, 27(23)*, (Dec. 1992),6303–6310.

Jeong, Chang–Wook, et al., "Plasma–Assisted Atomic Layer Growth of High–Quality Aluminum Oxide Thin Films", *Japanese Journal of Applied Physics, Part 1: Regular Papers and Short Notes and Review Papers, 40(1)*, (Jan. 2001),285–289.

Juppo, Marika, et al., "Use of 1,1Dimethylhydrazine in the Atomic Layer Deposition of Transition Metal Nitride Thin Films", *Journal of the Electrochemical Society, 147(9)*, (Sep. 2000),3377–3381.

Kawai, Y, et al., "Ultra–low–temperature growth of high–integrity gate oxide films by low–energy Ion–assisted oxidation", *Applied Physics Letters,64(17)*, (Apr. 1994),2223–2225.

Keomany, D, et al., "Sol gel preparation of mixed cerium–titanium oxide thin films", *Solar Energy Materials and Solar Cells, 33(4)*, (Aug. 1994),429–441.

Kim, C T., et al., "Application of Al2O3 Grown by Atomic Layer Deposition to DRAM and FeRAM", *International Symposium in Integrated Ferroelectrics*, (Mar. 2000),316.

Kim, D., et al., "Atomic Control of Substrate Termination and Heteroepitaxial Growth of SrTiO3/LaAlO3 Films", *Journal of the Korean Physical Society, 36(6)*, (Jun. 2000), 444–448.

Kim, Y, et al., "Substrate dependence on the optical properties of Al/sub 2/O/sub 3/ films grown by atomic layer deposition", *Applied Physics Letters, 71(25, 22 )*, (Dec. 1997),3604–3606.

Klaus, J W., et al., "Atomic layer deposition of tungsten nitride films using sequential surface reactions", *Journal of the Electrochemical Society, 147(3)*, (Mar. 2000),1175–81.

Koo, J, "Study on the characteristics of TiAlN thin film deposited by atomic layer deposition method", *Journal of Vacuum Science & Technology A–Vacuum Surfaces & Films, 19(6)*, (Nov. 2001),2831–4.

Krauter, G., et al., "Room Temperature Silicon Wafer Bonding with Ultra–Thin Polymer Films", *Advanced Materials, 9(5)*, (1997),417–420.

Kukli, Kaupo, et al., "Atomic Layer Deposition of Titanium Oxide Til4 and H2O2", *Chemical Vapor Deposition, 6(6)*, (2000),303–310.

Kukli, K, et al., "Controlled growth of yttrium oxysulphide thin films by atomic layer deposition", *Materials Science Forum, 315–317*, (1999),216–221.

Kukli, Kaupo, et al., "Dielectric Properties of Zirconium Oxide Grown by Atomic Layer Deposition from Iodide Precursor", *Journal of The Electrochemical Society, 148(12)*, (2001),F227–F232.

Lee, A E., et al., "Epitaxially grown sputtered LaAlO3 films", *Applied Physics Letters, 5(19)*, (Nov. 1990),2019–2021.

Lee, Cheng–Chung, et al., "Ion–assisted deposition of silver thin films", *Thin Solid Films, 359(1)* (Jan. 2000),95–97.

Lee, Dong H., et al., "Metalorganic chemical vapor deposition of TiO/sub 2/:N anatase thin film on Si substrate", *Applied Physics Letters, 66(7)*, (Feb. 1995),815–816.

Lee, L P., et al., "Monolithic 77 K dc SQUID magnetometer", *Applied Physics Letters, 59(23)*, (Dec. 1991),3051–3053.

Lei, T., "Epitaxial Growth and Characterization of Zinc–Blende Gallium Nitride on (001) Silicon", *Journal of Applied Physics, 71(10)* (May 1992),4993–4943.

Leskela, M, et al., "ALD precursor chemistry: Evolution and future challenges", *Journal de Physique IV (Proceedings), 9(8)*, (Sep. 1999),837–852.

Liu, C. T., "Circuit Requirement and Integration Challenges of Thin Gate Dielectrics for Ultra Small MOSFETs", *International Electron Devices Meeting 1998, Technical Digest*, (1998),747–750.

Liu, Y C., et al., "Growth of ultrathin SiO/sub 2/ by surface irradiation with an O/sub 2/+Ar electron cyclotron resonance microwave plasma at low temperatures", *Journal of Applied Physics, 85(3)*, (Feb. 1999),1911–1915.

Luan, H., "High Quality Ta2O5 Gate Dielectrics with Tox, eq<10A", *IEDM*, (1999),pp. 141–144.

Lucovsky, G, et al., "Microscopic model for enhanced dielectric constants in low concentration SiO/sub 2/–rich noncrystalline Zr and Hf silicate alloys", *Applied Physics Letters, 77(18)*, (Oct. 2000),2912–2914.

Lusky, E, et al., "Characterization of Channel Hot Electron Injection by the Subthreshold Slope of NROM Device", *IEEE Electron Device Letters, 22(11)*, (Nov. 2001),556–558.

Maayan, Eduardo, et al., "A 512Mb NROM Flash Data Storage Memory with 8MB/s Data Rate", *Solid–State Circuits Conference, 2002, Digest of Technical Papers, ISSCC*, (2002),100–101.

Marlid, Bjorn, et al., "Atomic layer deposition of BN thin films", *Thin Solid Films, 402(1–2)*, (Jan. 2002),167–171.

Martin, P J., et al., "Ion–beam–assisted deposition of thin films", *Applied Optics, 22(1)*, (Jan. 1983),178–184.

Martins, R, "Transport Properties of Doped Silicon Oxycarbide Microcrystalline Films Produced by Spatial Separation Techniques", *Solar Energy Materials and Solar Cells, 41–42*, (1996),493–517.

Martins, R., "Wide Band Gap Microcrystalline Silicon Thin Films", *Diffusion and Defect Data: Solid State Phenomena, 44–46, Part 1*, Scitec Publications,(1995),299–346.

Min, Jae–Sik, et al., "Atomic layer deposition of TiN films by alternate supply of tetrakis (ethylmethylamino)–titanium and ammonia", *Japanese Journal of Applied Physics Part 1–Regular Papers Short Notes & Review Papers, vol. 37, No. 9A*, (Sep. 1998),4999–5004.

Min, J., "Metal–organic atomic–layer deposition of titanium–silicon–nitride films", *Applied Physics Letters, 75(11)*, (1999),1521–1523.

Moazzami, R, "Endurance properties of Ferroelectric PZT thin films", *Int. Electron Devices Mtg.*, San Francisco, (1990),417–20.

Moazzami, R, "Ferroelectric PZT thin films for semiconductor memory", *Ph.D Thesis, University of California, Berkeley*, (1991).

Molnar, R., "Grown of Gallium Nitride by Electron–Cyclotron Resonance Plasma–Assisted Molecular–Beam Epitaxy: The Role of Charged Species", *Journal of Applied Physics, 76(8)*, (Oct. 1994),4587–4595.

Molodyk, A A., et al., "Volatile Surfactant–Assisted MOCVD: Application to LaAlO3 Thin Film Growth", *Chemical Vapor Deposition, 6(3)*, (Jun. 2000),133–138.

Molsa, Heini, et al., "Growth of yttrium oxide thin films from beta –diketonate precursor", *Advanced Materials for Optics and Electronics, 4(6)*, (Nov.–Dec. 1994),389–400.

Morishita, S, "Atomic–layer chemical–vapor–deposition of SiO/sub 2/ by cyclic exposures of CH/sub 3/OSi(NCO)/sub 3/ and H/sub 2/O/sub 2/", *Japanese Journal of Applied Physics Part 1–Regular Papers Short Notes & Review Papers, vol. 34, No. 10*, (Oct. 1995),5738–42.

Moriwaki, M, "Improved metal gate process by simultaneous gate–oxide nitridation during W/WN/sub x/gate formation", *Japanese Journal of Applied Physics Part 1–Regular Papers Short Notes & Review Papers, 39(4B)*, (Apr. 2000),2177–2180.

Muller, D. A., et al., "The electronic structure at the atomic scale of ultrathin gate oxides", *Nature, 399(6738)*, (Jun. 24, 1999),758–61.

Nakagawara, Osamu, et al., "Electrical properties of (Zr, Sn)TiO4 dielectric thin film prepared by pulsed laser deposition", *Journal of Applied Physics, 80(1)*, (Jul. 1996), 388–392.

Nakajima, Anri, et al., "NH/sub 3/–annealed atomic–layer–deposited silicon nitride as a high–k gate dielectric with high reliability", *Applied Physics Letters, 80(7)*, (Feb. 2002), 1252–1254.

Nakajima, Anri, "Soft breakdown free atomic–layer–deposited silicon–nitride/SiO/sub 2/ stack gate dielectrics", *International Electron Devices Meeting, Technical Digest*, (2001),6.5.1–4.

Neumayer, D A., et al., "Materials characterization of ZrO/sub 2/–SiO/sub 2/ and HfO/sub 2/–SiO/sub 2/ binary oxides deposited by chemical solution deposition", *Journal of Applied Physics, 90(4)*, (Aug. 15, 2001),1801–1808.

Nieminen, Minna, et al., "Formation and stability of lanthanum oxide thin films deposited from B–diketonate precursor", *Applied Surface Science, 174(2)*, (Apr. 16, 2001), 155–165.

Niilisk, A, "Atomic–scale optical monitoring of the initial growth of TiO2 thin films", *Proceedings of the SPIE—The International Society for Optical Engineering, 4318)*, (2001),72–77.

Ohring, Milton, "The Materials Science of Thin Films", *Boston: Academic Press*, (1992),118,121,125.

Osten, H. J., et al., "High–k gate dielectrics with ultra–low leakage current based on praseodymium oxide", *International Electron Devices Meeting 2000, Technical Digest. IEDM*, (2000),653–656.

Pan, Tung M., et al., "High quality ultrathin CoTiO/sub 3/ high–k gate dielectrics", *Electrochemical and Solid–State Letters, 3(9)* (Sep. 2000),433–434.

Pan, Tung M., et al., "High–k cobalt–titanium oxide dielectrics formed by oxidation of sputtered Co/Ti or Ti/Co films", *Applied Physics Letters, 78(10)*, (Mar. 5, 2001),1439–1441.

Pankove, J., "Photoemission from GaN", *Applied Physics Letters, 25*, (1974),53–55.

Papadas, C., "Modeling of the Intrinsic Retention Characteristics of Flotox Eeprom Cells Under Elevated Temperature Conditions", *IEEE Transaction on Electron Devices, 42*, (Apr. 1995),678–682.

Park, Byung–Eun, et al., "Electrical properties of LaAlO3/Si and Sr0.8Bi2.2Ta2O9/LaAlO3/Si structures", *Applied Physics Letters, 79(6)*, (Aug. 2001),806–808.

Park, Jin–Seong, et al., "Plasma–Enhanced Atomic Layer Deposition of Tantalum Nitrides Using Hydrogen Radicals as a Reducing Agent", *Electrochemical & Solid–State Letters, 4(4)*, (Apr. 2001),C17–19.

Perkins, Charles M., et al., "Electrical and materials properties of ZrO2 gate dielectrics grown by atomic layer chemical vapor deposition", *Applied Physics Letters, 78(16)*, (Apr. 2001),2357–2359.

Puurunen, R L., et al., "Growth of aluminum nitride on porous silica by atomic layer chemical vapour deposition", *Applied Surface Science, 165(2–3)*, (Sep. 12, 2000),193–202.

Qi, Wen–Jie, et al., "MOSCAP and MOSFET characteristics using ZrO2 gate dielectric deposited directly on Si", *Electron Devices Meeting, 1999. IEDM Technical Digest. International*, (1999),145–148.

Qi, Wen–Jie, et al., "Performance of MOSFETs with ultra thin ZrO/sub 2/ and Zr silicate gate dielectrics", *2000 Symposium on VLSI Technology, Digest of Technical Papers*, (2000),40–41.

Ramakrishnan, E S., et al., "Dielectric properties of radio frequency magnetron sputter deposited zirconium titanate–based thin films", *Journal of the Electrochemical Society, 145(1)*, (Jan. 1998),358–362.

Rayner Jr., G, et al., "The structure of plasma–deposited and annealed pseudo–binary ZrO2–SiO2 alloys", *Materials Research Society Symposium—Proceedings, 611*,(2000), C131–C139.

Renlund, G. M., "Silicon oxycarbide glasses: Part I. Preparation and chemistry", *J. Mater. Res.*, (Dec., 1991),pp. 2716–2722.

Renlund, G. M., "Silicon oxycarbide glasses: Part II. Structure and properties", *J. Mater. Res.*, vol. 6, No. 12,(Dec., 1991),pp. 2723–2734.

Ritala, Mikko, "Atomic Layer Epitaxy Growth of Titanium, Zirconium and Hafnium Dioxide Thin Films", *Annales Academiae Scientiarum Fennicae*, (1994),24–25.

Ritala, Mikko, et al., "Zirconium dioxide thin films deposited by ALE using zirconium tetrachloride as precursor", *Applied Surface Science, 75*, (Jan. 1994),333–340.

Robertson, J., "Band offsets of wide–band–gap oxides and implications for future electronic devices", *Journal of Vacuum Science & Technology B (Microelectronics and Nanometer Structures), 18(3)*, (May–Jun. 2000),1785–1791.

Rotondaro, A L., et al., "Advances CMOS Transistors with a Novel HfSiON Gate Dielectric", *Symposium on VLSI Technology Digest of Technical Papers*, (2002),148–149.

Saito, Yuji, et al., "Advantage of Radical Oxidation for Improving Reliability of Ultra–Thin Gate Oxide", *2000 Symposium on VLSI Technology Digest of Technical Papers*, (2000),176–177.

Saito, Yuji, et al., "High–Integrity Silicon Oxide Grown at Low–Temperature by Atomic Oxygen Generated in High–Density Kyrpton Plasma", *Extended Abstracts of the 1999 International Conference on Solid State Devices and Materials*, (1999),152–153.

Sanders, B W., et al., "Zinc Oxysulfide Thin Films Grown by Atomic Layer Deposition", *Chemistry of Materials, 4(5)*, (1992),1005–1011.

Semiconductor Industry Associati, "International Technology for Semiconductor Roadmap", http://public.itrs.net/Files/2001/TRS/Links/1999_SIA_Roadmap/, (1999).

Shanware, A, et al., "Reliability evaluation of HfSiOn gate dielectric film with 12.8 A SiO2 equivalent thickness", *International Electron Devices Meeting, Technical Digest*, (2001),137–140.

She, Min, et al., "Modeling and design study of nanocrystal memory devices", *IEEE Device Research Conference*, (2001),139–40.

Shimada, H, et al., "Tantalum nitride metal gate FD–SOI CMOS FETs using low resistivity self–grown bcc–tantalum layer", *IEEE Transactions on Electron Devices, vol. 48, No. 8*, (Aug. 200),1619–1626.

Shin, Chang H., et al., "Fabrication and Characterization of MFISFET Using Al2O3 Insulating Layer for Non–volatile Memory", *12th International Symposium in Integrated Ferroelectrics*, (Mar. 2000),9 pages.

Shirota, R, et al., "A 2.3 mu m/sup 2/ memory cell structure for 16 Mb NAND EEPROMs", *International Electron Devices Meeting 1990. Technical Digest*, San Francisco, (1990),103–106.

Sneh, Ofer, et al., "Thin film atomic layer deposition equipment for semiconductor processing", *Thin Solid Films, 402(1–2)*, (Jan. 1, 2002),248–261.

Solanki, Raj, et al., "Atomic Layer Deposition of Copper Seed Layers", *Electrochemical & Solid–State Letters, 3(10)*, (Oct. 2000),479–480.

Song, Hyun–Jung, et al., "Atomic Layer Deposition of Ta2O5 Films Using Ta(OC2H5)5 and NH3", *Ultrathin SiO/sub 2/ and High–K Materials for ULSI Gate Dielectrics. Symposium*, (1999),469–471.

Suntola, T, "Atomic layer epitaxy", *Thin Solid Films, 216(1)*, (Aug. 28, 1992),84–89.

Suntola, T., "Atomic Layer Epitaxy", *Handbook of Crystal Growth, 3: Thin Films of Epitaxy, Part B: Growth Mechanics and Dynamics*, Amsterdam,(1994),602–663.

Sze, S M., "Physics of Semiconductor Devices", *New York: Wiley*, (1981),504–506.

Sze, S M., "Physics of Semiconductor Devices", *New York: Wiley*, (1981),431.

Sze, S M., "Physics of Semiconductor Devices", *New York: Wiley*, (1981),473.

Takemoto, J. H., et al., "Microstrip Resonators and Filters Using High–TC Superconducting Thin Films on LaAlO3", *IEEE Transaction on Magnetics, 27(2)*, (Mar. 1991),2549–2552.

Tarre, A, et al., "Comparative study of low–temperature chloride atomic–layer chemical vapor deposition of TiO2 and SnO2", *Applied Surface Science, 175–176*, (May 2001), 111–116.

Van Dover, R B., "Amorphous lanthanide–doped TiOx dielectric films", *Applied Physics Letters, 74(20)*, (May 1999),3041–3043.

Van Dover, Robert B., et al., "Deposition of Uniform Zr–Sn–Ti–O films by ON–Axis Reactive Sputtering", *IEEE Electron Device Letters, 19(9)*, (Sep. 1998),329–331.

Van Dover, R. B., et al., "Discovery of a useful thin–film dielectric using a composition–spread approach", *Nature, 392(6672)*, (Mar. 12, 1998),162–4.

Viirola, H, "Controlled growth of antimony–doped tin dioxide thin films by atomic layer epitaxy", *Thin Solid Films, 251*, (Nov. 1994),127–135.

Viirola, H, "Controlled growth of tin oxide thin films by atomic layer epitaxy", *Thin Solid Films, 249(2)*, (Sep. 1994), 144–149.

Visokay, M R., "Application of HfSiON as a gate dielectric material", *Applied Physics Letters, 80(17)*, (Apr. 2002), 3183–3185.

Wei, L S., et al., "Trapping, emission and generation in MNOS memory devices", *Solid–State Electronics, 17(6)*, (Jun. 1974),591–8.

White, M H., et al., "Characterization of thin–oxide MNOS memory transistors", *IEEE Transactions on Electron Devices, ED–19(12)*, (Dec. 1972),1280–1288.

White, M H., "Direct tunneling in metal–nitride–oxide–silicon (MNOS) structures", *Programme of the 31st physical electronics conference*, (1971),1.

Wilk, G D., et al., "Hafnium and zirconium silicates for advanced gate dielectrics", *Journal of Applied Physics, 87(1)*, (Jan. 2000),484–492.

Wilk, G. D., et al., "High–K gate dielectrics: Current status and materials properties considerations", *Journal of Applied Physics, 89(10)* (2001),5243–5275.

Wolf, Stanley, et al., "Silicon Processing for the VLSI Era—Volume I: Process Technology", *Second Edition, Lattice Press*, Sunset Beach, California,(2000),443.

Wood, S W., "Ferroelectric memory design", *M.A.Sc. thesis, University of Toronto*, (1992).

Yagishita, A, "Dynamic threshold voltage damascene metal gate MOSFET (DT–DMG–MOS) with low threshold voltage, high drive current and uniform electrical characteristics", *International Electron Devices Meeting 2000, Technical Digest. IEDM*, (Dec. 2000),663–666.

Yoder, M, "Wide Bandgap Semiconductor Materials and Devices", *IEEE Transactions on Electron Devices, 43*, (Oct. 1996),1633–1636.

Zhang, H., "Atomic Layer Deposition of High Dielectric Constant Nanolaminates", *Journal of The Electrochemical Society, 148(4)*, (Apr. 2001),F63–F66.

Zhu, W J., et al., "Current transport in metal/hafnium oxide/silicon structure", *IEEE Electron Device Letters, 23*, (2002),97–99.

Zhu, W, et al., "HfO2 and HfAlO for CMOS: Thermal Stability and Current Tranport", *IEEE International Electron Device Meeting 2001*, (2001),463–466.

Zucker, O, et al., "Application of Oxygen Plasma Processing to Silicon Direct Bonding", *Sensors and Actuators A, 36*, (1993),227–231.

Liu, A., et al., "Low Programming Voltages and Long Retention Time in Metal Nanocrystal EEPROM Devices", *Device Research Conference, IEEE, ISBN: 0–7803–7014–7*, (Jun. 25–27, 2001),79–80.

* cited by examiner

WRITE ONCE READ ONLY MEMORY EMPLOYING FLOATING GATES

CROSS REFERENCE TO RELATED APPLICATIONS

This application is related to the following co-pending, commonly assigned U.S. patent application: "Write Once Read Only Memory Employing Charge Trapping in Insulators," Ser. No. 10/177,077, which is filed on even date herewith and is incorporated by reference.

FIELD OF THE INVENTION

The present invention relates generally to semiconductor integrated circuits and, more particularly, to write once read only memory employing floating gates.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell. Another type of high speed, low cost memory includes floating gate memory cells. A conventional horizontal floating gate transistor structure includes a source region and a drain region separated by a channel region in a horizontal substrate. A floating gate is separated by a thin tunnel gate oxide. The structure is programmed by storing a charge on the floating gate. A control gate is separated from the floating gate by an intergate dielectric. A charge stored on the floating gate effects the conductivity of the cell when a read voltage potential is applied to the control gate. The state of cell can thus be determined by sensing a change in the device conductivity between the programmed and un-programmed states.

With successive generations of DRAM chips, an emphasis continues to be placed on increasing array density and maximizing chip real estate while minimizing the cost of manufacture. It is further desirable to increase array density with little or no modification of the DRAM optimized process flow.

A requirement exists for memory devices which need only be programmed once, as for instance to function as an electronic film in a camera. If the memory arrays have a very high density then they can store a large number of very high resolution images in a digital camera. If the memory is inexpensive then it can for instance replace the light sensitive films which are used to store images in conventional cameras.

Thus, there is a need for improved DRAM technology compatible write once read only memory. It is desirable that such write once read only memory be fabricated on a DRAM chip with little or no modification of the DRAM process flow. It is further desirable that such write once read only memory operate with lower programming voltages than that used by conventional DRAM cells, yet still hold sufficient charge to withstand the effects of parasitic capacitances and noise due to circuit operation.

REFERENCES

L. Forbes, W. P. Noble and E. H. Cloud, "MOSFET Technology for Programmable Address Decode and Correction," U.S. Pat. No. 6,521,950;

B. Eitan et al., "Characterization of Channel Hot Electron Injection by the Subthreshold Slope of NROM device," IEEE Electron Device Lett., Vol. 22, No. 11, pp. 556–558, (November 2001);

B. Etian et al., "NROM: A novel localized Trapping, 2-Bit Nonvolatile Memory Cell," IEEE Electron Device Left., Vol. 21, No. 11, pp. 543–545, (November 2000));

S. Sze, Physics of Semiconductor Devices, Wiley, N.Y., 1981, pp. 504–506);

L. Forbes and J. Geusic, "Memory Using Insulator Traps," U.S. Pat. No. 6,140,181.

SUMMARY OF THE INVENTION

The above mentioned problems for creating DRAM technology compatible write once read only memory cells as well as other problems are addressed by the present invention and will be understood by reading and studying the following specification. This disclosure teaches structures and methods using floating gate devices as write once read only memory in a DRAM integrated circuit. The structures and methods use the existing process sequence for MOSFET's in DRAM technology.

In particular, an illustrative embodiment of the present invention includes a write once read only memory cell. The write once read only memory cell includes a floating gate transistor. The floating gate transistor has a first source/drain region, a second source/drain region, a channel region between the first and the second source/drain regions, a floating gate separated from the channel region by a gate insulator, and a control gate separated from the floating gate by a gate dielectric. A plug couples the first source/drain region to an array plate. A bitline is coupled to the second source/drain region. The floating gate transistor can be programmed by operation in a reverse direction trapping charge on the floating gate adjacent to the first source/drain region such that the programmed floating gate transistor operates at reduced drain source current when read in a forward direction.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
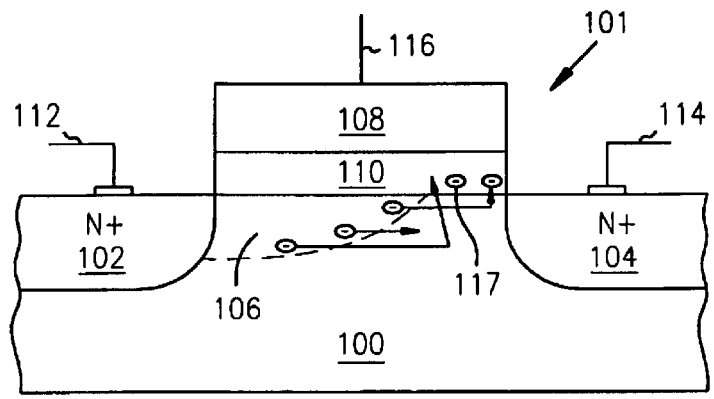
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
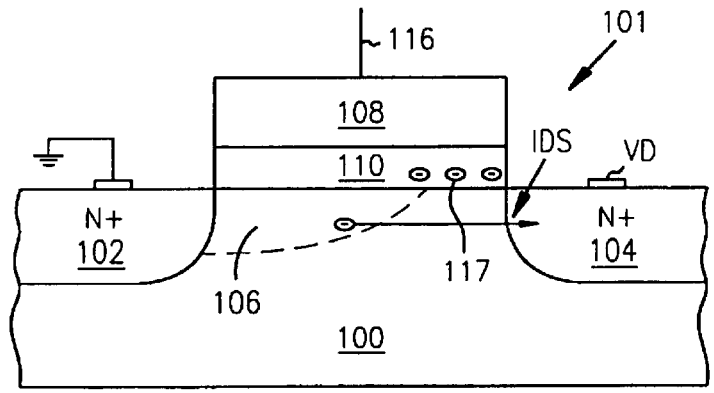
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
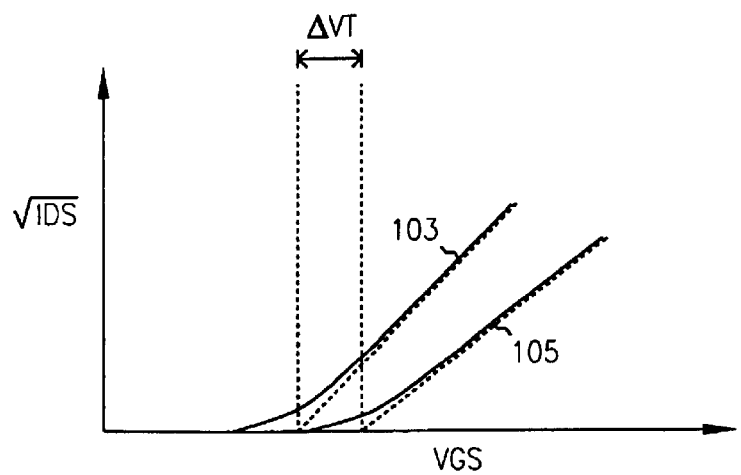
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, $\Delta VT$ represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 103 represents the charge carrier mobility in the channel 106 for FIG. 1A having no electrons trapped in the gate oxide 110. Slope 105 represents the charge mobility in the channel 106 for the conventional MOSFET of FIG. 1B having electrons 117 trapped in the gate oxide 110 near the drain region 104. As shown by a comparison of slope 103 and slope 105 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

The inventor, along with others, have previously described programmable memory devices and functions based on the reverse stressing of MOSFET's in a conventional CMOS process and technology in order to form programmable address decode and correction in U.S. Pat. No. 6,521,950 entitled "MOSFET Technology for Programmable Address Decode and Correction." That disclosure, however, did not describe write once read only memory solutions, but rather address decode and correction issues. The inventors also describe write once read only memory cells employing charge trapping in gate insulators for conventional MOSFETs. The same is described in co-pending, commonly assigned U.S. patent application, entitled "Write Once Read Only Memory Employing Charge Trapping in Insulators," Ser. No. 10/177077. The present application, however, describes write once read only memory cells formed from conventional flash memory device structures.

According to the teachings of the present invention, normal flash memory cells can be programmed by operation in the reverse direction and utilizing avalanche hot electron injection to trap electrons on the floating gate of the floating gate transistor. When the programmed floating gate transistor is subsequently operated in the forward direction the electrons trapped on the floating gate cause the channel to have a different threshold voltage. The novel programmed floating gate transistors of the present invention conduct significantly less current than conventional flash cells which have not been programmed. These electrons will remain trapped on the floating gate unless negative control gate voltages are applied. The electrons will not be removed from the floating gate when positive or zero control gate voltages are applied. Erasure can be accomplished by applying negative control gate voltages and/or increasing the temperature with negative control gate bias applied to cause the trapped electrons on the floating gate to be re-emitted back into the silicon channel of the MOSFET.

Figure 2A:
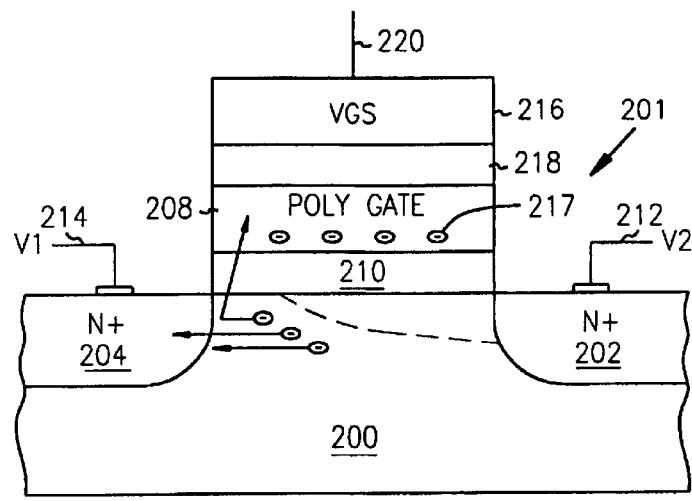
FIG. 2A is a diagram of a programmed MOSFET which can be used as a write once read only memory cell according to the teachings of the present invention.

FIG. 2A is a diagram of a programmed floating gate transistor which can be used as a write once read only memory cell according to the teachings of the present invention. As shown in FIG. 2A the write once read only memory cell 201 includes a floating gate transistor in a substrate 200 which has a first source/drain region 202, a second source/drain region 204, and a channel region 206 between the first and second source/drain regions, 202 and 204. In one embodiment, the first source/drain region 202 includes a source region 202 for the floating gate transistor and the second source/drain region 204 includes a drain region 204 for the floating gate transistor. FIG. 2A further illustrates a floating gate 208 separated from the channel region 206 by a floating gate insulator 210. An array plate 212 is coupled to the first source/drain region 202 and a transmission line 214 is coupled to the second source/drain region 204. In one embodiment, the transmission line 214 includes a bit line 214. Further as shown in FIG. 2A, a control gate 216 is separated from the floating gate 208 by a gate dielectric 218.

As stated above, write once read only memory cell 201 is comprised of a programmed floating gate transistor. This programmed floating gate transistor has a charge 217 trapped on the floating gate 208. In one embodiment, the charge 217 trapped on the floating gate 208 includes a trapped electron charge 217.

Figure 2B:
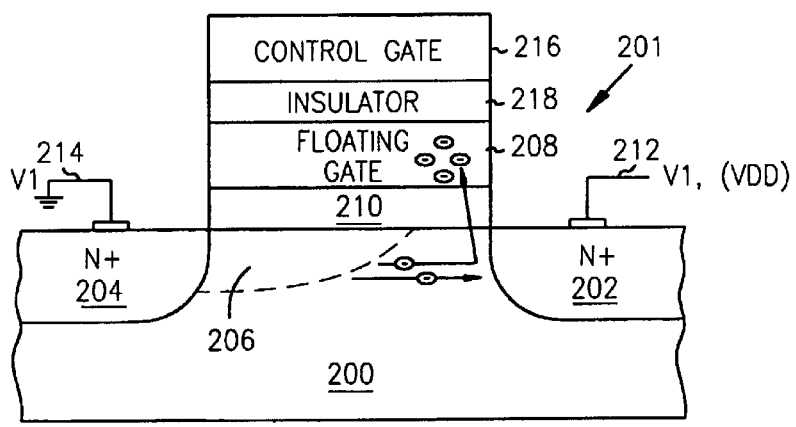
FIG. 2B is a diagram suitable for explaining the method by which the MOSFET of the write once read only memory cell of the present invention can be programmed to achieve the embodiments of the present invention.

FIG. 2B is a diagram suitable for explaining the method by which the floating gate of the write once read only memory cell 201 of the present invention can be programmed to achieve the embodiments of the present invention. As shown in FIG. 2B the method includes programming the floating gate transistor. Programming the floating gate transistor includes applying a first voltage potential V1 to a drain region 204 of the floating gate transistor and a second voltage potential V2 to the source region 202.

In one embodiment, applying a first voltage potential V1 to the drain region 204 of the floating gate transistor includes grounding the drain region 204 of the floating gate transistor as shown in FIG. 2B. In this embodiment, applying a second voltage potential V2 to the source region 202 includes biasing the array plate 212 to a voltage higher than VDD, as shown in FIG. 2B. A gate potential VGS is applied to the control gate 216 of the floating gate transistor. In one embodiment, the gate potential VGS includes a voltage potential which is less than the second voltage potential V2, but which is sufficient to establish conduction in the channel 206 of the floating gate transistor between the drain region 204 and the source region 202. As shown in FIG. 2B, applying the first, second and gate potentials (V1, V2, and VGS respectively) to the floating gate transistor creates a hot electron injection into the floating gate 208 of the floating gate transistor adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the floating gate 208 adjacent to the source region 202. Here the charge carriers become trapped.

In an alternative embodiment, applying a first voltage potential V1 to the drain region 204 of the floating gate transistor includes biasing the drain region 204 of the floating gate transistor to a voltage higher than VDD. In this embodiment, applying a second voltage potential V2 to the source region 202 includes grounding the array plate 212. A gate potential VGS is applied to the control gate 216 of the floating gate transistor. In one embodiment, the gate potential VGS includes a voltage potential which is less than the first voltage potential V1, but which is sufficient to establish conduction in the channel 206 of the floating gate transistor between the drain region 204 and the source region 202. Applying the first, second and gate potentials (V1, V2, and VGS respectively) to the floating gate transistor creates a hot electron injection into the floating gate 208 of the floating gate transistor adjacent to the drain region 204. In other words, applying the first, second and gate potentials (V1, V2, and VGS respectively) provides enough energy to the charge carriers, e.g. electrons, being conducted across the channel 206 that, once the charge carriers are near the drain region 204, a number of the charge carriers get excited into the floating gate 208 adjacent to the drain region 204. Here the charge carriers become trapped as shown in FIG. 2A.

In one embodiment of the present invention, the method is continued by subsequently operating the floating gate transistor in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the floating gate. That is, a gate potential can be applied to the control gate 216 by a wordline 220 in an effort to form a conduction channel between the source and the drain regions as done with addressing and reading conventional DRAM cells. However, now in its programmed state, the conduction channel 206 of the floating gate transistor will have a higher voltage threshold.

Figure 2C:
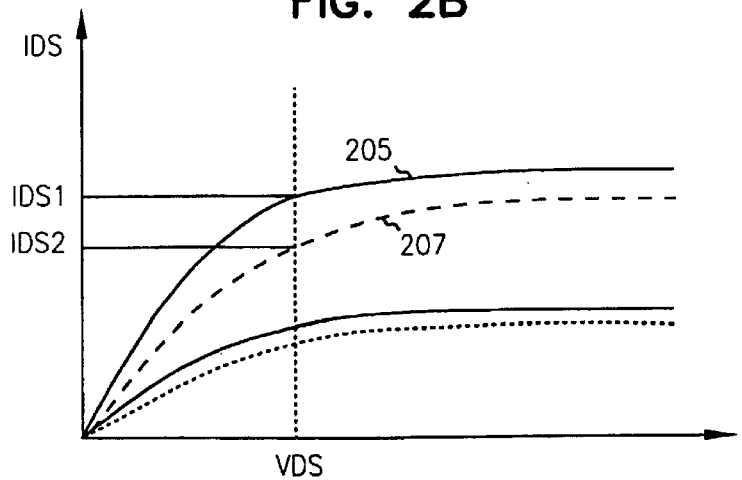
FIG. 2C is a graph plotting the current signal (Ids) detected at the drain region versus a voltage potential, or drain voltage, (VDS) set up between the drain region and the source region (Ids vs. VDS).

FIG. 2C is a graph plotting a current signal (IDS) detected at the second source/drain region 204 versus a voltage potential, or drain voltage, (VDS) set up between the second source/drain region 204 and the first source/drain region 202 (IDS vs. VDS). In one embodiment, VDS represents the voltage potential set up between the drain region 204 and the source region 202. In FIG. 2C, the curve plotted as 205 represents the conduction behavior of a conventional floating gate transistor where the transistor is not programmed (is normal or not stressed) according to the teachings of the present invention. The curve 207 represents the conduction behavior of the programmed floating gate transistor (stressed), described above in connection with FIG. 2A, according to the teachings of the present invention. As shown in FIG. 2C, for a particular drain voltage, VDS, the current signal (IDS2) detected at the second source/drain region 204 for the programmed floating gate transistor (curve 207) is significantly lower than the current signal (IDS1) detected at the second source/drain region 204 for the conventional floating gate cell (curve 205) which is not programmed according to the teachings of the present invention. Again, this is attributed to the fact that the channel 206 in the programmed floating gate transistor of the present invention has a different voltage threshold.

Some of these effects have recently been described for use in a different device structure, called an NROM, for flash memories. This latter work in Israel and Germany is based on employing charge trapping in a silicon nitride layer in a non-conventional flash memory device structure. Charge trapping in silicon nitride gate insulators was the basic mechanism used in MNOS memory devices, and the present inventor, along with another, disclosed charge trapping at isolated point defects in gate insulators in U.S. Pat. No. 6,140,181 entitled "Memory Using Insulator Traps." However, none of the above described references addressed forming write once read only memory cells in conventional flash memory cell device structures.

That is, in contrast to the above work, the present invention discloses programming a floating gate transistor to trap charge and reading the device to form a write once read only memory (WOROM) based on a modification of DRAM technology.

Figure 3:
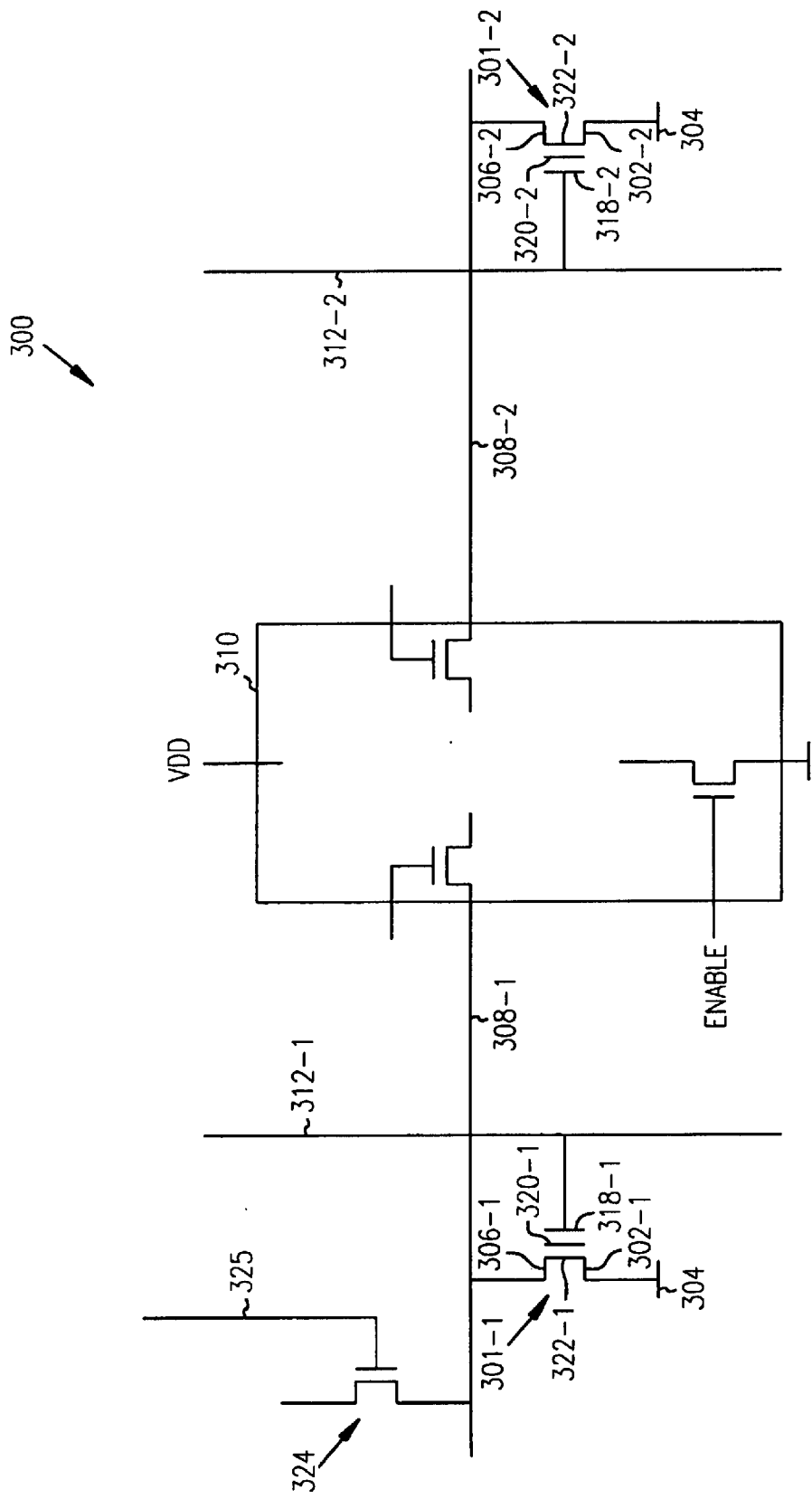
FIG. 3 illustrates a portion of a memory array according to the teachings of the present invention.

FIG. 3 illustrates a portion of a memory array 300 according to the teachings of the present invention. The memory in FIG. 3, is shown illustrating a pair of write once read only floating gate memory cells 301-1 and 301-2 formed according to the teachings of the present invention. As one of ordinary skill in the art will understand upon reading this disclosure, any number of write once and read only floating gate memory cells can be organized in an array, but for ease of illustration only two are displayed in FIG. 3. As shown in FIG. 3, a first source/drain region, 302-1 and 302-2 respectively, is coupled to an array plate 304. A second source/drain region, 306-1 and 306-2 respectively, is coupled to a bitline, 308-1 and 308-2 respectively. Each of the bitlines, 308-1 and 308-2, couple to a sense amplifier, shown generally at 310. A wordline, 312-1 and 312-2 respectively, is couple to a control gate, 318-1 and 318-2 respectively, for each of the write once read only floating gate memory cells, 301-1 and 301-2. A floating gate, 320-1 and 320-2 respectively, is separated from a channel region, 322-1 and 322-2, in the write once read only floating gate memory cells, 301-1 and 301-2, beneath the control gate, 318-1 and 318-2. Finally, a write data/precharge circuit is shown at 324 for coupling a first or a second potential to bitline 308-1. The illustrated write data/precharge circuit 324 is connected to a write data/precharge control line 325. As one of ordinary skill in the art will understand upon reading this disclosure, the write data/precharge circuit 324 is adapted to couple either a ground to the bitline 308-1 during a write operation in the reverse direction, or alternatively to precharge the bitline 308-1 to fractional voltage of VDD during a read operation in the forward direction. As one of ordinary skill in the art will understand upon reading this disclosure, the array plate 304 can be biased to a voltage higher than VDD during a write operation in the reverse direction, or alternatively grounded during a read operation in the forward direction.

As shown in FIG. 3, the array structure 300 has no capacitors. Instead, according to the teachings of the present invention, the first source/drain region or source region, 302-1 and 302-2, are coupled via a conductive plug directly to the array plate 304. In order to write, the array plate 304 is biased to voltage higher than VDD and the devices stressed in the reverse direction by grounding the data or bit line, 308-1 or 308-2. If the write once read only memory cell, 301-1 or 301-2, is selected by a word line address, 312-1 or 312-2, then the write once read only memory cell, 301-1 or 301-2, will conduct and be stressed with accompanying hot electron injection into the cells floating gate, 320-1 or 320-2, adjacent to the source region, 302-1 or 302-2. Alternatively, the array plate 304 can be grounded and the data or bit line, 308-1 or 308-2 driven to some voltage higher than VDD. Again, if the write once read only memory cell, 301-1 or 301-2, is selected by a word line address, 312-1 or 312-2, then the write once read only memory cell, 301-1 or 301-2, will conduct and be stressed with accompanying hot electron injection into the cells floating gate, 320-1 or 320-2, adjacent to the drain region, 306-1 or 306-2. During read, the write once read only floating gate memory cell, 301-1 or 301-2, is operated in the forward direction with the array plate 304 grounded and the bit line, 308-1 or 308-2, and respective second source/drain region or drain region, 306-1 and 306-2, of the cells precharged to some fractional voltage of VDD. If the device is addressed by the word line, 312-1 or 312-2, then its conductivity will be determined by the presence or absence of stored charge on the cells floating gate, 320-1 or 320-2, and so detected using the DRAM sense amplifier 310. The operation of DRAM sense amplifiers is described, for example, in U.S. Pat. Nos. 5,627,785; 5,280,205; and 5,042,011, all assigned to Micron Technology Inc., and incorporated by reference herein. The array would thus be addressed and read in the conventional manner used in DRAM's, but programmed as write once read only memory cells in a novel fashion.

In operation the devices can be subjected to hot electron stress in the reverse direction by biasing the array plate 304, and read while grounding the array plate 304 to compare a stressed write once read only memory cell, e.g. cell 301-1, to an unstressed dummy device/cell, e.g. 301-2, as shown in FIG. 3. The write and possible erase feature could be used during manufacture and test to initially program all cells or devices to have similar or matching conductivity before use in the field. The sense amplifier 310 can then detect small differences in cell or device characteristics due to stress induced changes in device characteristics during the write operation.

As one of ordinary skill in the art will understand upon reading this disclosure such arrays of write once read only memory cells are conveniently realized by a modification of DRAM technology. That is, the transfer devices in the DRAM arrays are replaced by flash memory type devices with floating gates. Conventional transistors for address decode and sense amplifiers can be fabricated after this step with normal thin gate insulators of silicon oxide. Because the devices in the array have a floating gate they can be erased by biasing the control or address gate with a large negative potential.

Figure 4A:
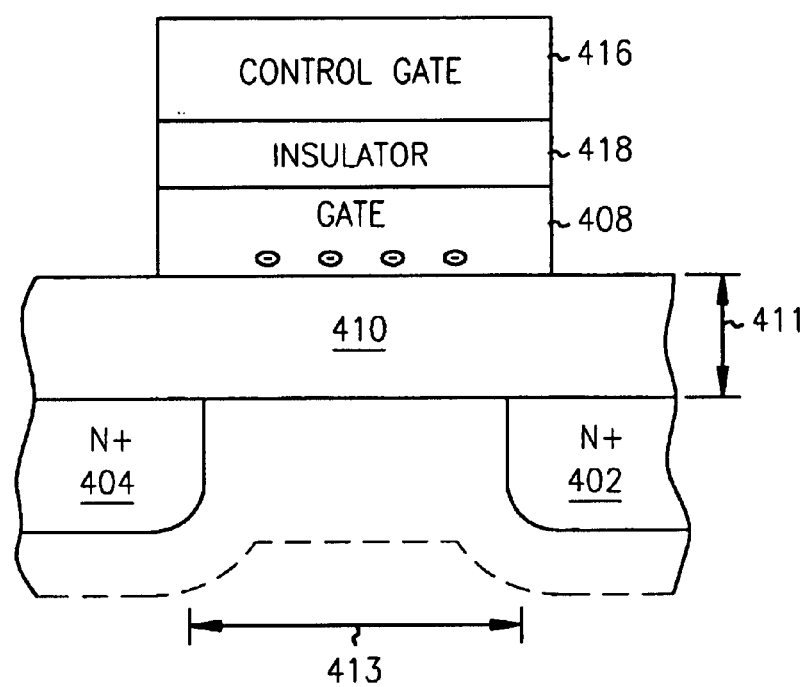
FIGS. 4A–4B illustrates the operation of the novel write once read only memory cell formed according to the teachings of the present invention.
Figure 4B:
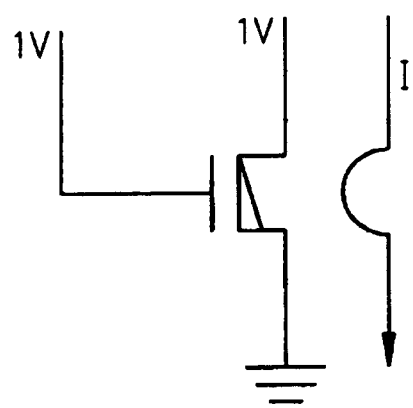
Figure 5:
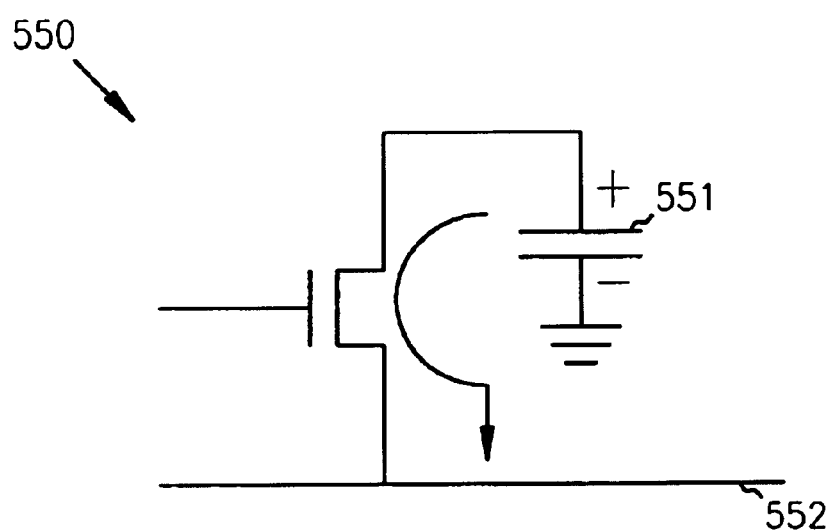
FIG. 5 illustrates the operation of a conventional DRAM cell.

FIGS. 4A–B and 5 are useful in illustrating the use of charge storage in the gate insulator to modulate the conductivity of the write once read only memory cell according to the teachings of the present invention. That is, FIGS. 4A–4B illustrates the operation of the novel write once read only memory cell 401 formed according to the teachings of the present invention. And, FIG. 5 illustrates the operation of a conventional DRAM cell 501. As shown in FIG. 4A, the gate insulator 410 is made thicker than in a conventional DRAM cell. For example, an embodiment of the gate insulator 410 has a thickness 411 equal to or greater than 10 nm or 100 Å ($10^{-6}$ cm). In the embodiment shown in FIG. 4A a write once read only memory cell has dimensions 413 of 0.1 μm ($10^{-5}$ cm) by 0.1 μm. The capacitance, Ci, of the structure depends on the dielectric constant, $\in_i$, and the thickness of the insulating layers, t. In an embodiment, the dielectric constant is $0.3 \times 10^{-12}$ F/cm and the thickness of the insulating layer is $10^{-6}$ cm such that Ci=$\in$i/t, Farads/cm$^2$ or $3 \times 10^{-7}$ F/cm$^2$. In one embodiment, a charge of $10^{12}$ electrons/cm$^2$ is programmed into the floating gate of the write once read only floating gate memory cell. This produces a stored charge $\Delta Q=10^{12}$ electrons/cm$^2 \times 1.6 \times 10^{-19}$ Coulombs. In this embodiment, the resulting change in the threshold voltage ($\Delta$Vt) of the write once read only floating gate memory cell will be approximately 0.5 Volts ($\Delta$Vt=$\Delta$Q/Ci or $1.6 \times 10^{-7}/3 \times 10^{-7}$=½ Volt). For $\Delta Q=10^{12}$ electrons/cm$^3$ in an area of $10^{-10}$ cm$^2$ this embodiment of the present invention involves trapping a charge of approximately 100 electrons in the floating gate of the write once read only floating gate memory cell. In this embodiment, an original $V_T$ is approximately ½ Volt and the $V_T$ with charge trapping is approximately 1 Volt.

FIG. 4B aids to further illustrate the conduction behavior of the novel write once read only floating gate memory cell of the present invention. As one of ordinary skill in the art will understand upon reading this disclosure, if the write once read only floating gate memory cell is being driven with a control gate voltage of 1.0 Volt (V) and the nominal threshold voltage without the floating gate charged is ½ V, then if the floating gate is charged the floating gate transistor of the present invention will be off and not conduct. That is, by trapping a charge of approximately 100 electrons in the floating gate of the write once read only floating gate memory cell, having dimensions of 0.1 μm ($10^{-5}$ cm) by 0.1 μm, will raise the threshold voltage of the write once read only floating gate memory cell to 1.0 Volt and a 1.0 Volt control gate potential will not be sufficient to turn the device on, e.g. Vt=1.0 V, I=0.

Conversely, if the nominal threshold voltage without the floating gate charged is ½, then I=μ$C_{OX}$×(W/L)×((Vgs−Vt)$^2$/2), or 12.5 μA, with μ$C_{OX}$=μ$C_i$=100 μA/V$^2$ and W/L=1. That is, the write once read only floating gate memory cell of the present invention, having the dimensions describe above will produce a current I=100 μA/V$^2$×(¼)×(½)=12.5 μA. Thus, in the present invention an un-written, or un-programmed write once read only floating gate memory cell can conduct a current of the order 12.5 μA, whereas if the floating gate is charged then the write once read only floating gate memory cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM cell 550 with a 30 femtoFarad (fF) storage capacitor 551 charged to 50 femto Coulombs (fC), if these are read over 5 nS then the average current on a bit line 552 is only 10 μA (I=50 fC/5 ns=10 μA). Thus, storing a 50 fC charge on the storage capacitor shown in FIG. 5 equates to storing 300,000 electrons (Q=50 fC/($1.6 \times 10^{-19}$)=$30 \times 10^4$=300,000 electrons).

According to the teachings of the present invention, the floating gate transistors in the array are utilized not just as passive on or off switches as transfer devices in DRAM arrays but rather as active devices providing gain. In the present invention, to program the floating gate transistor "off," requires only a stored charge in the floating gate of about 100 electrons if the area is 0.1 μm by 0.1 μm. And, if the write once read only floating gate memory cell is un-programmed, e.g. no stored charge trapped in the floating gate, and if the floating gate transistor is addressed over 10 nS a of current of 12.5 μA is provided. The integrated drain current then has a charge of 125 fC or 800,000 electrons. This is in comparison to the charge on a DRAM capacitor of 50 fC which is only about 300,000 electrons. Hence, the use of the floating gate transistors in the array as active devices with gain, rather than just switches, provides an amplification of the stored charge, in the floating gate, from 100 to 800,000 electrons over a read address period of 10 nS.

Figure 6:
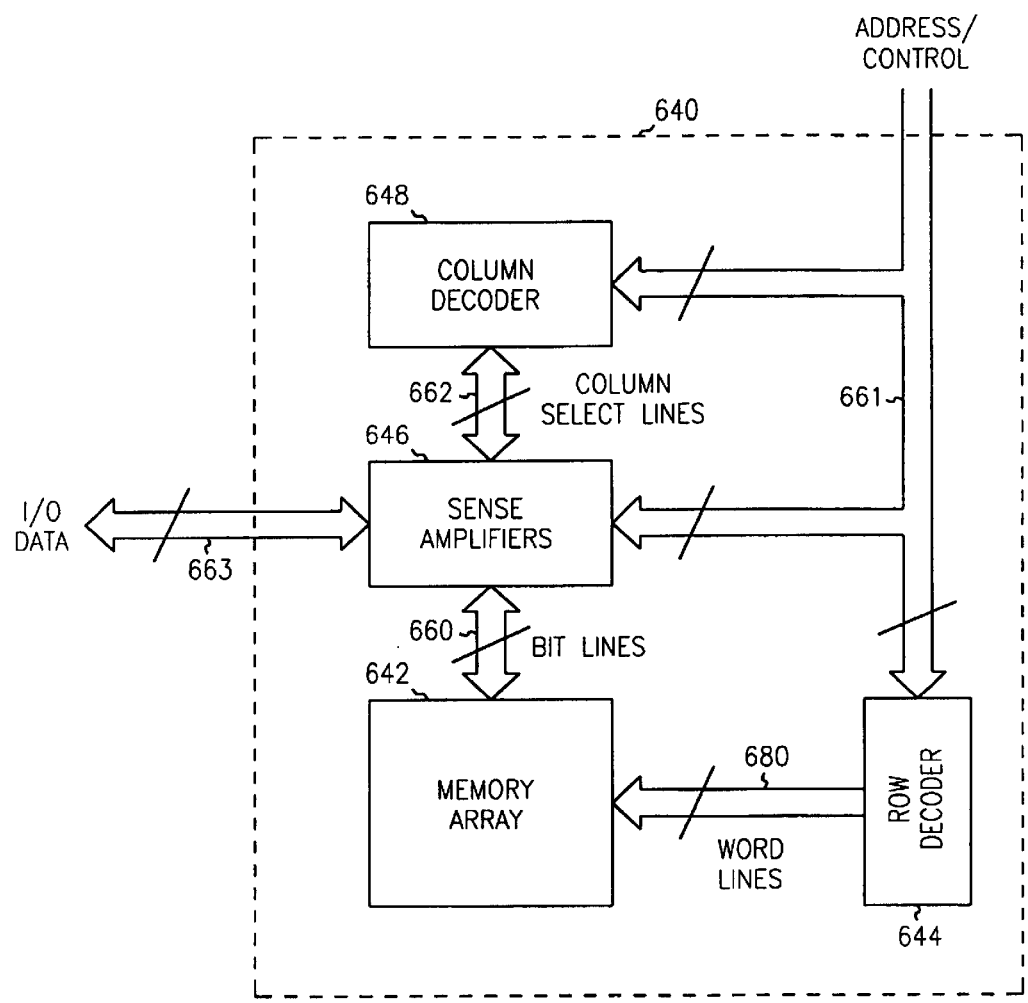
FIG. 6 illustrates a memory device according to the teachings of the present invention.

In FIG. 6 a memory device is illustrated according to the teachings of the present invention. The memory device 640 contains a memory array 642, row and column decoders 644, 648 and a sense amplifier circuit 646. The memory array 642 consists of a plurality of write once read only floating gate memory cells 600, formed according to the teachings of the present invention whose word lines 680 and bit lines 660 are commonly arranged into rows and columns, respectively. The bit lines 660 of the memory array 642 are connected to the sense amplifier circuit 646, while its word lines 680 are connected to the row decoder 644. Address and control signals are input on address/control lines 661 into the memory device 640 and connected to the column decoder 648, sense amplifier circuit 646 and row decoder 644 and are used to gain read and write access, among other things, to the memory array 642.

The column decoder 648 is connected to the sense amplifier circuit 646 via control and column select signals on column select lines 662. The sense amplifier circuit 646 receives input data destined for the memory array 642 and outputs data read from the memory array 642 over input/output (I/O) data lines 663. Data is read from the cells of the memory array 642 by activating a word line 680 (via the row decoder 644), which couples all of the memory cells corresponding to that word line to respective bit lines 660, which define the columns of the array. One or more bit lines 660 are also activated. When a particular word line 680 and bit lines 660 are activated, the sense amplifier circuit 646 connected to a bit line column detects and amplifies the conduction sensed through a given write once read only floating gate memory cell and transferred to its bit line 660 by measuring the potential difference between the activated bit line 660 and a reference line which may be an inactive bit line. Again, in the read operation the source region of a given cell is couple to a grounded array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 7:
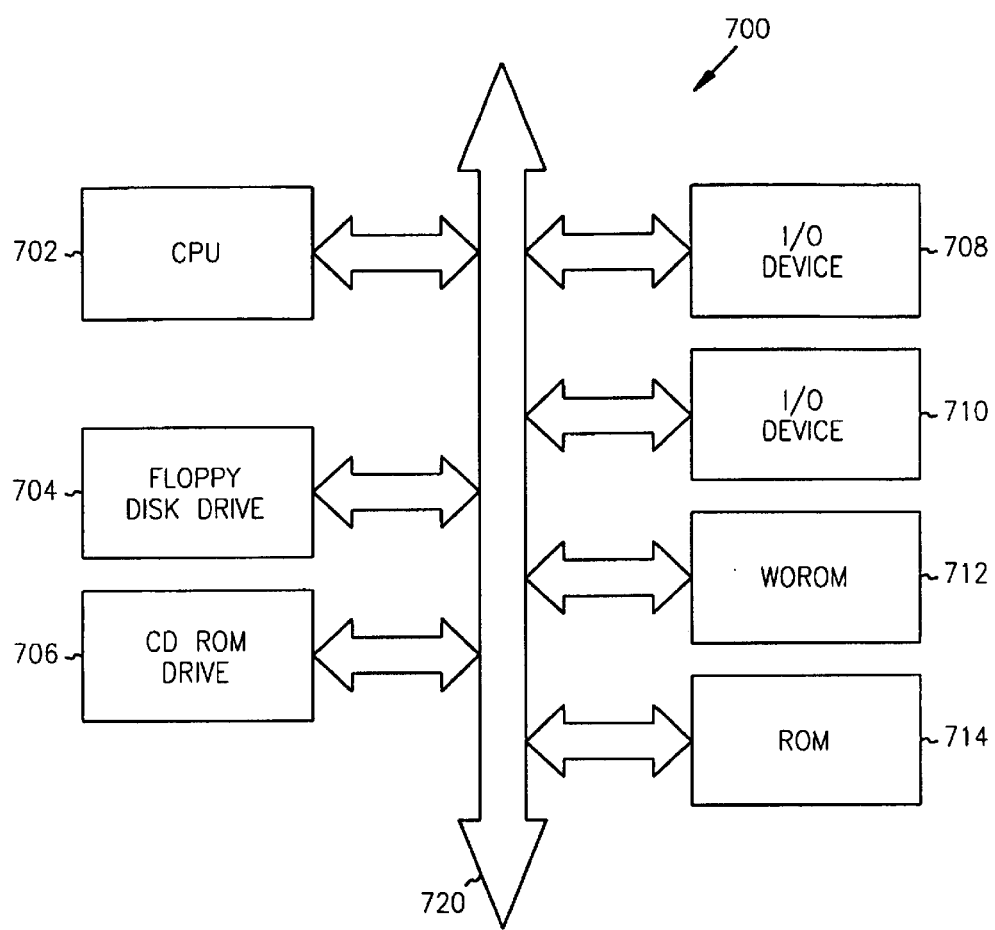
FIG. 7 is a block diagram of an electrical system, or processor-based system, utilizing write once read only memory constructed in accordance with the present invention.

FIG. 7 is a block diagram of an electrical system, or processor-based system, 700 utilizing write once read only floating gate memory 712 constructed in accordance with the present invention. That is, the write once read only memory (WOROM) 712 utilizes the modified flash cell as explained and described in detail in connection with FIGS. 2–4. The processor-based system 700 may be a computer system, a process control system or any other system employing a processor and associated memory. The system 700 includes a central processing unit (CPU) 702, e.g., a microprocessor, that communicates with the write once read only floating gate memory 712 and an I/O device 708 over a bus 720. It must be noted that the bus 720 may be a series of buses and bridges commonly used in a processor-based system, but for convenience purposes only, the bus 720 has been illustrated as a single bus. A second I/O device 710 is illustrated, but is not necessary to practice the invention. The processor-based system 700 can also includes read-only memory (ROM) 714 and may include peripheral devices such as a floppy disk drive 704 and a compact disk (CD) ROM drive 706 that also communicates with the CPU 702 over the bus 720 as is well known in the art.

It will be appreciated by those skilled in the art that additional circuitry and control signals can be provided, and that the memory device 700 has been simplified to help focus on the invention. At least one of the write once read only floating gate memory cell in WOROM 712 includes a programmed flash cell.

It will be understood that the embodiment shown in FIG. 7 illustrates an embodiment for electronic system circuitry in which the novel memory cells of the present invention are used. The illustration of system 700, as shown in FIG. 7, is intended to provide a general understanding of one application for the structure and circuitry of the present invention, and is not intended to serve as a complete description of all the elements and features of an electronic system using the novel memory cell structures. Further, the invention is equally applicable to any size and type of memory device 700 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

Utilization of a modification of well established DRAM technology and arrays will serve to afford an inexpensive memory device which can be regarded as disposable if the information is later transferred to another medium, for instance CDROM's. The high density of DRAM array structures will afford the storage of a large volume of digital data or images at a very low cost per bit. There are many applications where the data need only be written once, the low cost of these memories will make it more efficient to just utilize a new memory array, and dispose of the old memory array, rather than trying to erase and reuse these arrays as is done with current flash memories.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A write once read only memory cell, comprising:
   a floating gate transistor, the floating gate transistor having a first source/drain region, a second source/drain region, a channel region between the first and the second source/drain regions, a floating gate separated from the channel region by a gate insulator, and a control gate separated from the floating gate by a gate dielectric;
   a plug coupled to the first source/drain region, wherein the plug couples the first source/drain region to an array plate;
   a transmission line coupled to the second source/drain region; and
   wherein the floating gate transistor is a programmed floating gate transistor having a charge trapped in the floating gate such that the programmed floating gate transistor operates at reduced drain source current.

2. The write once read only memory cell of claim 1, wherein the first source/drain region of the floating gate transistor includes a source region and the second source/drain region of the floating gate transistor includes a drain region.

3. The write once read only memory cell of claim 1, wherein the transmission line includes a bit line.

4. The write once read only memory cell of claim 1, wherein the charge trapped in the floating gate includes a trapped electron charge.

5. The write once read only memory cell of claim 1, wherein the write once read only memory (WOROM) cell is formed in a modified dynamic random access memory (DRAM) fabrication process.

6. The write once read only memory cell of claim 1, wherein the gate insulator has a thickness of at least 10 nanometers (nm).

7. A write once read only memory cell, comprising:
   a floating gate transistor formed according to a modified DRAM fabrication process, the floating gate transistor having a first source/drain region, a second source/drain region, a channel region between the first and the second source/drain regions, a floating gate separated from the channel region by a gate insulator, and a control gate separated from the floating gate by a gate dielectric;
   a wordline coupled to the control gate;
   an array plate coupled to the source region;
   a bit line coupled to the drain region; and
   wherein the floating gate transistor is a programmed floating gate transistor having a charge trapped in the floating gate.

8. The write once read only memory cell of claim 7, wherein the gate insulator has a thickness of at least 10 nanometers (nm).

9. A memory array, comprising:
   a number of write once read only floating gate memory cells, wherein each write once read only floating gate memory cell includes a first source/drain region, a second source/drain region, a channel region between the first and the second source/drain regions, a floating gate separated from the channel region by a gate insulator, and a control gate separated from the floating gate by a gate dielectric;
   a number of bit lines coupled to the second source/drain region of each write once read only floating gate memory cell along rows of the memory array;

a number of word lines coupled to the control gate of each write once read only floating gate memory cell along columns of the memory array;

an array plate, wherein the first source/drain region of each write once read only floating gate memory cell is coupled to the array plate by a conductive plug; and wherein at least one of write once read only floating gate memory cells is a programmed floating gate transistor having a charge trapped in the floating gate such that the programmed floating gate transistor operates at reduced drain source current.

10. The memory array of claim 9, wherein the charge trapped in the floating gate includes a charge of approximately 100 electrons.

11. The memory array of claim 9, wherein the first source/drain region of the floating gate cell includes a source region and the second source/drain region of the floating gate cell includes a drain region.

12. The memory array of claim 9, wherein the number of write once read only memory (WOROM) cell are formed in a modified dynamic random access memory (DRAM) fabrication process.

13. The memory array of claim 9, wherein the gate insulator of each write once read only floating gate memory cell has a thickness of at least 10 nanometers (nm).

14. A memory device, comprising:

a memory array, wherein the memory array includes a number of write once read only floating gate memory cells, wherein each write once read only floating gate memory cell includes a source region, a drain region, a channel region between the source and the drain regions, a floating gate separated from the channel region by a gate insulator, and a control gate separated from the floating gate by a gate dielectric;

a number of bitlines coupled to the drain region of each write once read only floating gate memory cell along rows of the memory array;

a number of wordlines coupled to the control gate of each write once read only floating gate memory cell along columns of the memory array;

an array plate, wherein the source region of each write once read only floating gate memory cell is coupled to the array plate by a conductive plug;

a wordline address decoder coupled to the number of wordlines;

a bitline address decoder coupled to the number of bitlines;

a sense amplifier coupled to the number of bitlines; and wherein at least one of write once read only floating gate memory cells is a programmed flash cell having a charge trapped in the floating gate such that the programmed flash cell operates at reduced drain/source current.

15. The memory device of claim 14, wherein the charge trapped in the floating gate includes a charge of approximately 100 electrons.

16. The memory device of claim 14, wherein the number of write once read only memory (WOROM) cell is formed in a modified dynamic random access memory (DRAM) fabrication process.

17. The memory device of claim 14, wherein the gate insulator of each write once read only floating gate memory cell has a thickness of at least 10 nanometers (nm).

18. The memory device of claim 14, wherein the wordline address decoder and the bitline address decoder each include conventionally fabricated transistors having thin gate insulators formed of silicon dioxide ($SiO_2$).

19. The memory device of claim 14, wherein the sense amplifier includes conventionally fabricated transistors having thin gate insulators formed of silicon dioxide ($SiO_2$).

20. An electronic system, comprising:

a processor; and a memory device coupled to the processor, wherein the memory device includes;

a memory array, wherein the memory array includes a number of write once read only floating gate memory cells, wherein each write once read only floating gate memory cell includes a source region, a drain region, a channel region between the source and the drain regions, a floating gate separated from the channel region by a gate insulator, and a control gate separated from the floating gate by a gate dielectric;

a number of bitlines coupled to the drain region of each write once read only floating gate memory cell along rows of the memory array;

a number of wordlines coupled to the control gate of each write once read only floating gate memory cell along columns of the memory array;

an array plate, wherein the source region of each write once read only floating gate memory cell is coupled to the array plate by a conductive plug;

a wordline address decoder coupled to the number of wordlines;

a bitline address decoder coupled to the number of bitlines;

a sense amplifier coupled to the number of bitlines; and wherein at least one of write once read only floating gate memory cells is a programmed flash cell having a charge trapped in the floating gate such that the programmed flash cell operates at reduced drain/source current.

21. The electronic system of claim 20, wherein the charge trapped in the floating gate includes a charge of approximately 100 electrons.

22. The electronic system of claim 20, wherein, in a read operation, the array plate is coupled to a ground potential, the drain region of an addressed write once read only floating gate memory cell is precharged to a fractional voltage of VDD, and the memory cell is selected by a wordline address.

23. The electronic system of claim 20, wherein, in a write operation, the array plate is biased to a voltage higher than VDD, the drain region of an addressed write once read only memory cell is couple to a ground, and the memory cell is selected by a wordline address.

* * * * *

UNITED STATES PATENT AND TRADEMARK OFFICE
CERTIFICATE OF CORRECTION

PATENT NO. : 7,193,893 B2
APPLICATION NO. : 10/177083
DATED : March 20, 2007
INVENTOR(S) : Forbes It is certified that error appears in the above-identified patent and that said Letters Patent is hereby corrected as shown below:

On the Title page, Item (56), under "Other Publications", in column 2, line 2, delete "doposition" and insert -- deposition --, therefor.

On Title page 2, Item (56), under "U.S. Patent Documents", in column 1, line 26, delete "365/165" and insert -- 365/185 --, therefor.

On Title page 3, Item (56), under "U.S. Patent Documents", in column 1, line 2, delete "385/185.18" and insert -- 365/185.18 --, therefor.

On Title page 3, Item (56), under "Other Publications", in column 2, line 1, delete "Technlogies" and insert -- Technologies --, therefor.

On Title page 3, Item (56), under "Other Publications", in column 2, line 11, delete "resisitiviey" and insert -- resistivity --, therefor.

On Title page 3, Item (56), under "Other Publications", in column 2, line 24, delete "Physicsl" and insert -- Physics --, therefor.

On Title page 4, Item (56), under "Other Publications", in column 1, line 18, delete "lanthanide" and insert -- lanthanide --, therefor.

On Title page 4, Item (56), under "Other Publications", in column 2, line 44, delete "5(19)" and insert -- 57(19) --, therefor.

On Title page 4, Item (56), under "Other Publications", in column 2, line 56, delete "4993" and insert -- 4933 --, therefor.

On Title page 5, Item (56), under "Other Publications", in column 1, line 1, after "sub 2/" insert -- on Si --.

On Title page 5, Item (56), under "Other Publications", in column 1, line 43, delete "Grown" and insert -- Growth --, therefor.

On Title page 5, Item (56), under "Other Publications", in column 2, line 26, after "4318" delete ")".

On Title page 6, Item (56), under "Other Publications", in column 1, line 29, delete "Advances" and insert -- Advanced --, therefor.

On Title page 6, Item (56), under "Other Publications", in column 1, line 38, delete "Kyrpton" and insert -- Krypton --, therefor.

UNITED STATES PATENT AND TRADEMARK OFFICE
CERTIFICATE OF CORRECTION

PATENT NO. : 7,193,893 B2
APPLICATION NO. : 10/177083
DATED : March 20, 2007
INVENTOR(S) : Forbes It is certified that error appears in the above-identified patent and that said Letters Patent is hereby corrected as shown below:

On Title page 7, Item (56), under "Other Publications", in column 2, line 10, delete "Liu, A." and insert -- Liu, Z. --, therefor.

In column 1, line 24, after "e.g" insert -- . --.

In column 2, line 6, delete "Left.," and insert -- Lett., --, therefor.

In column 2, line 7, after "2000)" delete ")".

In column 2, line 9, after "506" delete ")".

In column 7, line 20, after "devices," insert -- charge trapping in aluminum oxide gates was the mechanism used in MIOS memory devices, --.

Signed and Sealed this

Nineteenth Day of June, 2007

JON W. DUDAS
*Director of the United States Patent and Trademark Office*